(12) United States Patent
Endo et al.

(10) Patent No.: US 7,655,385 B2
(45) Date of Patent: Feb. 2, 2010

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 325 days.

(21) Appl. No.: 11/723,056

(22) Filed: Mar. 16, 2007

(65) Prior Publication Data

US 2007/0287102 A1     Dec. 13, 2007

Related U.S. Application Data

(62) Division of application No. 10/715,433, filed on Nov. 19, 2003, now Pat. No. 7,393,794.

(30) Foreign Application Priority Data

Jun. 23, 2003     (JP)     ............................. 2003-177884

(51) Int. Cl.
    *G03F 7/26*     (2006.01)
(52) U.S. Cl. .................. 430/311; 430/322; 430/961
(58) Field of Classification Search ................. 430/311, 430/322, 961
    See application file for complete search history.

(56) References Cited

U.S. PATENT DOCUMENTS

| | | | |
|---|---|---|---|
| 3,895,147 A | 7/1975 | Ahn et al. | |
| 5,312,516 A | 5/1994 | Douglas et al. | |
| 5,731,364 A | 3/1998 | Sinta et al. | |
| 5,741,628 A | 4/1998 | Matsuo et al. | |
| 5,846,692 A | 12/1998 | Katsuyama et al. | |
| 5,880,169 A | 3/1999 | Osawa et al. | |
| 6,120,974 A | 9/2000 | Matsuo et al. | |
| 6,340,635 B1 | 1/2002 | Toyota et al. | |
| 6,387,598 B2 | 5/2002 | Matsuo et al. | |
| 6,429,142 B1 | 8/2002 | Peng et al. | |
| 2003/0143490 A1 | 7/2003 | Kozawa et al. | |
| 2003/0228740 A1 | 12/2003 | Nagai et al. | |
| 2005/0009365 A1 | 1/2005 | Sugeta et al. | |

FOREIGN PATENT DOCUMENTS

| | | |
|---|---|---|
| JP | 3-192361 | 8/1991 |
| JP | 9-222724 | 8/1997 |
| JP | 9-323970 | 12/1997 |
| JP | 10-120628 | 5/1998 |
| JP | 10-303114 | 11/1998 |

OTHER PUBLICATIONS

Japanese Office Action, with English translation, issued in Japanese Patent Application No. JP 2003-177884, mailed Oct. 30, 2007.
Switkes, M., et al., "Resolution Enhancement of 157 nm Lithography by Liquid Immersion", Proceedings of SPIE, Mar. 5, 2002, vol. 4691, pp. 459-465, SPIE, United States.
Switkes, M, et al. "Immersion Lithography at 157 nm." , J. Vac. Sci. Technol., B19(6), Nov./Dec. 2001, pp. 2353-2356.

*Primary Examiner*—Kathleen Duda
(74) *Attorney, Agent, or Firm*—McDermott Will & Emery LLP (57) ABSTRACT

After forming a resist film including a hygroscopic compound, pattern exposure is performed by selectively irradiating the resist film with exposing light while supplying water onto the resist film. After the pattern exposure, the resist film is developed so as to form a resist pattern.

7 Claims, 7 Drawing Sheets

PATTERN FORMATION METHOD

RELATED APPLICATIONS

This application is a divisional of application Ser. No. 10/715,433, filed on Nov. 19, 2003 now U.S. Pat. No. 7,393,794, which in turn claims the benefit of Japanese Application No. 2003-177884, filed on Jun. 23, 2003, the disclosures of which Applications are incorporated by reference herein.

BACKGROUND OF THE INVENTION

The present invention relates to a pattern formation method for use in fabrication process and the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (M. Switkes and M. Rothschild, "Immersion lithography at 157 nm", J. Vac. Sci. Technol., B19, 2353 (2001)).

In the immersion lithography, a region in an exposure system sandwiched between a projection lens and a resist film formed on a wafer is filled with a solution having a refractive index n, and therefore, the NA (numerical aperture) of the exposure system has a value n·NA. As a result, the resolution of the resist film can be improved.

Now, a conventional pattern formation method using the immersion lithography will be described with reference to FIGS. 7A through 7D.

Figure 7A:
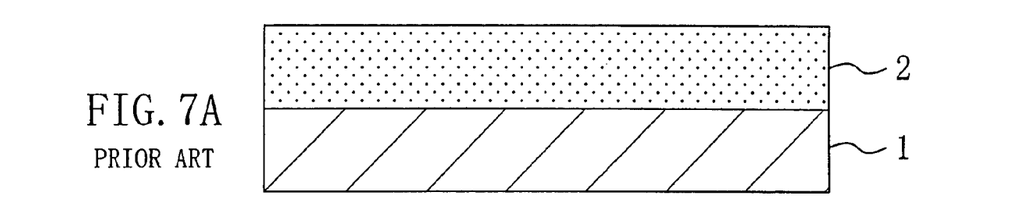
FIGS. 7A, 7B, 7C and 7D are cross-sectional views for showing procedures in a conventional pattern formation method.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Solvent: propylene glycol monomethyl ether acetate . . . 20 g Next, as shown in FIG. 7A, the aforementioned chemically amplified resist material is applied on a substrate 1 so as to form a resist film 2 with a thickness of 0.35 μm.

Figure 7B:
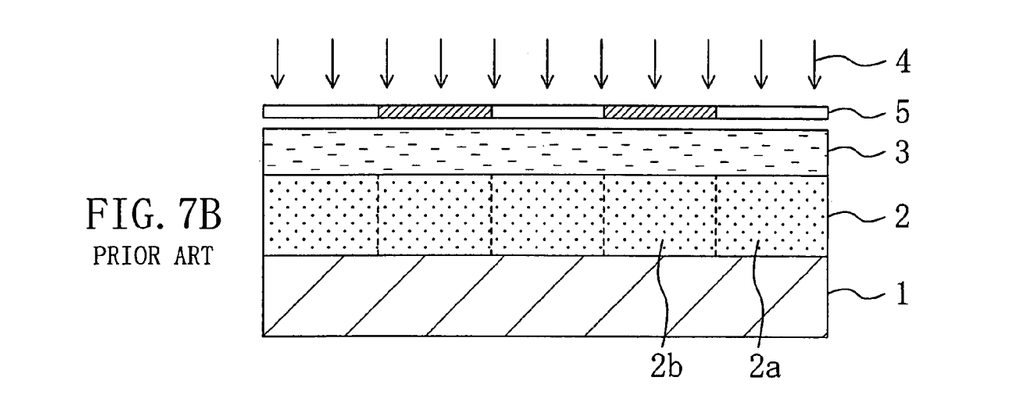

Then, as shown in FIG. 7B, while supplying water 3 onto the resist film 2, pattern exposure is carried out by irradiating the resist film 2 with exposing light 4 of ArF excimer laser with NA of 0.65 through a mask 5. Although a projection lens for condensing the exposing light 4 having passed through the mask 5 on the surface of the resist film 2 is not shown in FIG. 7B, a region sandwiched between the projection lens and the resist film 2 is filled with the water 3. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

Figure 7C:
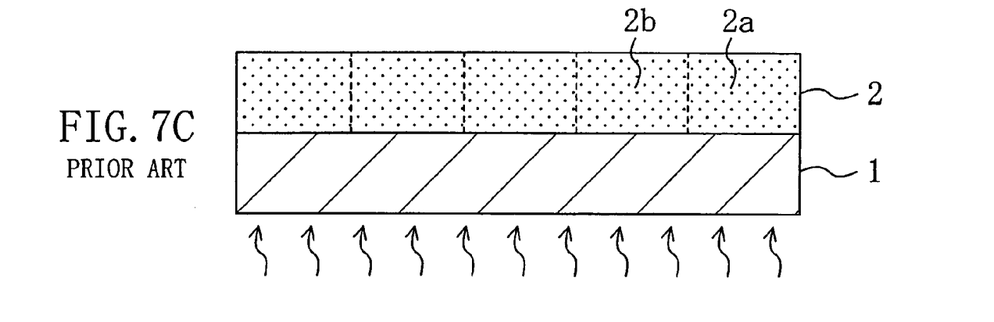

After the pattern exposure, as shown in FIG. 7C, the resist film 2 is baked with a hot plate at a temperature of 110° C. for 60 seconds, and the resultant resist film is developed with a 2.38 wt % tetramethylammonium hydroxide developer (alkaline developer). In this manner, a resist pattern 6 made of the unexposed portion 2b of the resist film 2 and having a line width of 0.09 μm can be obtained as shown in FIG. 7D.

Figure 7D:
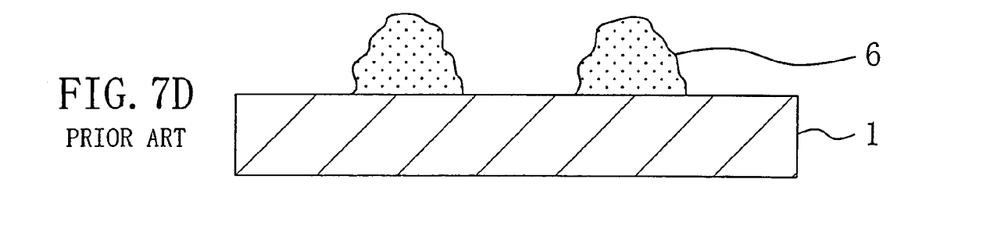

As shown in FIG. 7D, however, the resist pattern 6 formed by the conventional pattern formation method is in a defective shape.

Although the positive chemically amplified resist material is used in the above-described conventional method, also when a negative chemically amplified resist material is used instead, the resultant resist pattern is in a defective shape.

When a resist pattern in such a defective shape is used for etching a target film, the resultant pattern is also in a defective shape, which disadvantageously lowers the productivity and the yield in the fabrication process for semiconductor devices.

SUMMARY OF THE INVENTION

In consideration of the aforementioned conventional problem, an object of the invention is forming a resist pattern in a good shape by the immersion lithography.

In order to achieve the object, the present inventors have examined the cause of the defective shape of the resist pattern formed by the conventional immersion lithography, resulting in finding the following: In the pattern exposure performed with the water supplied on the resist film, the water present on the resist film is evaporated, and therefore, a space, namely, a portion where there is no water, is formed in an upper portion of the region sandwiched between the projection lens and the resist film. This space causes a phenomenon that the value of the NA of the exposure system is shifted from a predetermined value or varied, resulting in causing the defective shape of the resist pattern.

The present invention was devised on the basis of this finding. According to the invention, a hygroscopic compound or a rare earth compound is supplied onto the surface of a resist film, so that the hygroscopic compound or the rare earth compound can make atmospheric vapor be incorporated into the surface of the resist film, and the invention is specifically practiced as follows:

The first pattern formation method of this invention includes the steps of forming a resist film made from a resist material including a hygroscopic compound; performing pattern exposure by selectively irradiating the resist film with exposing light while supplying water onto the resist film; and forming a resist pattern by developing the resist film after the pattern exposure.

According to the first pattern formation method, atmospheric vapor is adhered onto the surface of the resist film owing to the function of the hygroscopic compound. The vapor adhered onto the surface of the resist film is incorporated into and integrated with the water filled between a projection lens and the resist film due to the surface tension of the water and the hydrophobic property of the surface of the resist film. Accordingly, even when the water filled between the projection lens and the resist film is evaporated and reduced in the quantity, the reduced quantity can be covered by the vapor incorporated from the air. Therefore, no space is formed in an upper portion of a region between the projection lens and the resist film and hence the value of the NA of an exposure system can be stabilized, resulting in forming the resist pattern in a good shape.

The second pattern formation method of this invention includes the steps of performing pattern exposure by selectively irradiating a resist film with exposing light while supplying, onto the resist film, water including a hygroscopic compound; and forming a resist pattern by developing the resist film after the pattern exposure.

According to the second pattern formation method, atmospheric vapor is adhered onto the surface of the resist film owing to the function of the hygroscopic compound. The vapor adhered onto the surface of the resist film is incorporated into and integrated with the water filled between a projection lens and the resist film due to the surface tension of the water and the hydrophobic property of the surface of the resist film. Accordingly, even when the water filled between the projection lens and the resist film is evaporated and reduced in the quantity, the reduced quantity can be covered by the vapor incorporated from the air. Therefore, no space is formed in an upper portion of a region between the projection lens and the resist film and hence the value of the NA of an exposure system can be stabilized, resulting in forming the resist pattern in a good shape.

In the first or second pattern formation method, the hygroscopic compound can be ethylene glycol, polyethylene glycol, glycerin or N-methyl-2-pyrrolidone.

The third pattern formation method of this invention includes the steps of forming a resist film made from a resist material including a rare earth compound; performing pattern exposure by selectively irradiating the resist film with exposing light while supplying water onto the resist film; and forming a resist pattern by developing the resist film after the pattern exposure.

According to the third pattern formation method, atmospheric vapor is adhered onto the surface of the resist film owing to the function of the rare earth compound. The vapor adhered onto the surface of the resist film is incorporated into and integrated with the water filled between a projection lens and the resist film due to the surface tension of the water and the hydrophobic property of the surface of the resist film. Accordingly, even when the water filled between the projection lens and the resist film is evaporated and reduced in the quantity, the reduced quantity can be covered by the vapor incorporated from the air. Therefore, no space is formed in an upper portion of a region between the projection lens and the resist film and hence the value of the NA of an exposure system can be stabilized, resulting in forming the resist pattern in a good shape.

The fourth pattern formation method of this invention includes the steps of supplying a solution including a rare earth compound onto a resist film; performing pattern exposure by selectively irradiating the resist film with exposing light while supplying water onto the resist film onto which the solution has been supplied; and forming a resist pattern by developing the resist film after the pattern exposure.

According to the fourth pattern formation method, since the rare earth compound is present on the surface of the resist film, atmospheric vapor is adhered onto the surface of the resist film owing to the function of the rare earth compound. The vapor adhered onto the surface of the resist film is incorporated into and integrated with the water filled between a projection lens and the resist film due to the surface tension of the water and the hydrophobic property of the surface of the resist film. Accordingly, even when the water filled between the projection lens and the resist film is evaporated and reduced in the quantity, the reduced quantity can be covered by the vapor incorporated from the air. Therefore, no space is formed in an upper portion of a region between the projection lens and the resist film and hence the value of the NA of an exposure system can be stabilized, resulting in forming the resist pattern in a good shape.

In the fourth pattern formation method, the solution can be supplied by a paddle method, a dip method or a spray method.

The fifth pattern formation method of this invention includes the steps of forming a film including a rare earth compound on a resist film; performing pattern exposure by selectively irradiating the resist film with exposing light while supplying water onto the film; and forming a resist pattern by developing the resist film after the pattern exposure.

According to the fifth pattern formation method, atmospheric vapor is adhered onto the surface of the film owing to the function of the rare earth compound. The vapor adhered onto the surface of the film formed on the resist film is incorporated into and integrated with the water filled between a projection lens and the film formed on the resist film due to the surface tension of the water. Accordingly, even when the water filled between the projection lens and the film formed on the resist film is evaporated and reduced in the quantity, the reduced quantity can be covered by the vapor incorporated from the air. Therefore, no space is formed in an upper portion of a region between the projection lens and the film formed on the resist film and hence the value of the NA of an exposure system can be stabilized, resulting in forming the resist pattern in a good shape.

In the fifth pattern formation method, the film including a rare earth compound can be a nonaqueous film.

In this case, the nonaqueous film can be an olefin film, and the olefin film can be a polyethylene film, a polypropylene film or a film of a copolymer of ethylene and propylene.

In any of the third through fifth pattern formation methods, the rare earth compound can be an oxide, a chloride, a sulfate, a nitrate, a hydroxide, an acetate or an octylate.

In any of the third through fifth pattern formation methods, the rare earth compound can be yttrium oxide, neodymium oxide, cerium oxide, lanthanum oxide or scandium oxide.

In any of the third through fifth pattern formation methods, the rare earth compound can be cerium chloride.

In any of the third through fifth pattern formation methods, the rare earth compound can be ceric sulfate or ammonium ceric sulfate.

In any of the third through fifth pattern formation methods, the rare earth compound can be cerium nitrate, ammonium cerium nitrate or lanthanum nitrate.

In any of the third through fifth pattern formation methods, the rare earth compound can be cerium hydroxide.

In any of the third through fifth pattern formation methods, the rare earth compound can be cerium acetate.

In any of the third through fifth pattern formation methods, the rare earth compound can be cerium octylate.

In any of the first through fifth pattern formation methods, the exposing light can be KrF excimer laser or ArF excimer laser.

DETAILED DESCRIPTION OF THE INVENTION

Embodiment 1

A pattern formation method according to Embodiment 1 of the invention will now be described with reference to FIGS. 1A through 1D.

Figure 1A:
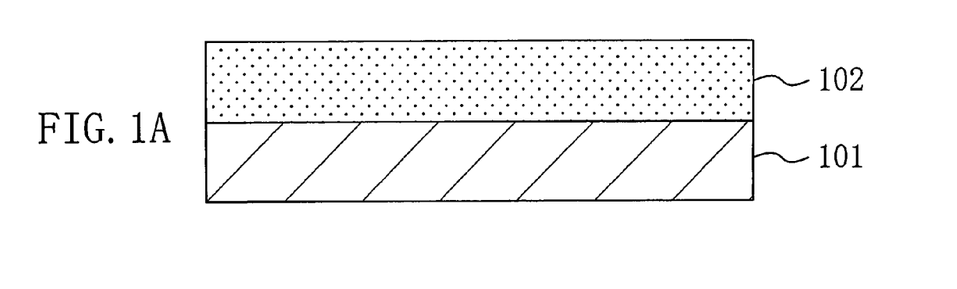
FIGS. 1A, 1B, 1C and 1D are cross-sectional views for showing procedures in a pattern formation method according to Embodiment 1 of the invention.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Hygroscopic compound: ethylene glycol . . . 0.08 g Solvent: propylene glycol monomethyl ether acetate . . . 20 g Next, as shown in FIG. 1A, the aforementioned chemically amplified resist material is applied on a substrate 101 so as to form a resist film 102 with a thickness of 0.35 μm.

Figure 1B:
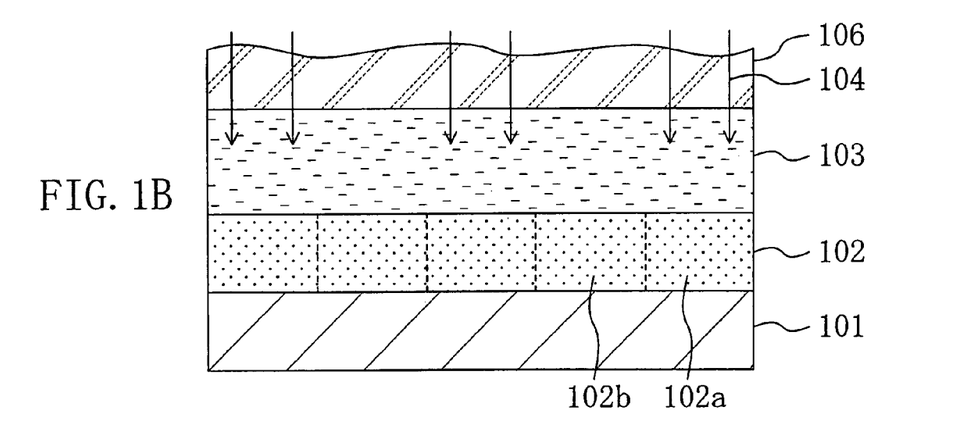

Then, as shown in FIG. 1B, with a region between the resist film 102 and a projection lens 106 filled with water 103 (having a refractive index n of 1.44), pattern exposure is carried out by irradiating the resist film 102 with exposing light 104 of ArF excimer laser with NA of 0.65 through a mask not shown. Thus, an exposed portion 102a of the resist film 102 becomes soluble in an alkaline developer because an acid is generated from the acid generator therein while an unexposed portion 102b of the resist film 102 remains insoluble in an alkaline developer because no acid is generated from the acid generator therein.

Figure 1C:
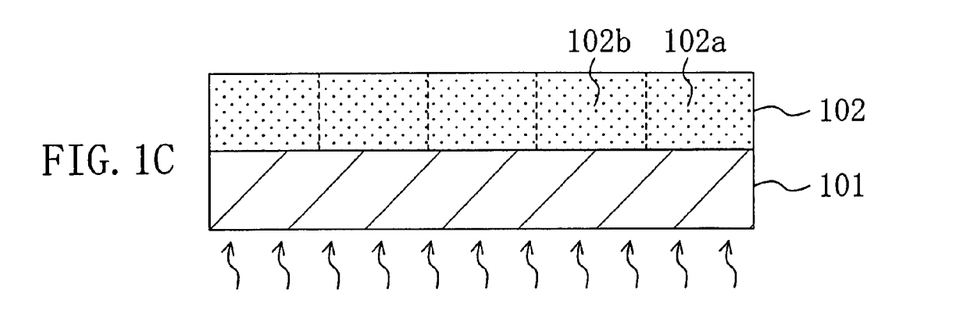
Figure 1D:
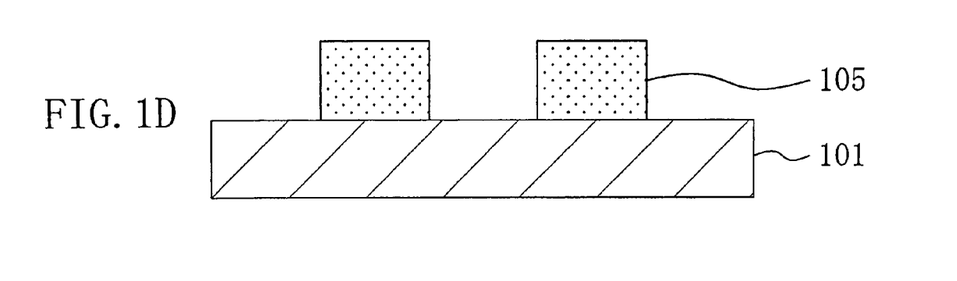

After the pattern exposure, as shown in FIG. 1C, the resist film 102 is baked with a hot plate at a temperature of 110° C. for 60 seconds, and the resultant resist film is developed with a 2.38 wt % tetramethylammonium hydroxide developer (alkaline developer). In this manner, a resist pattern 105 made of the unexposed portion 102b of the resist film 102 and having a line width of 0.09 μm can be formed in a good rectangular shape as shown in FIG. 1D.

In Embodiment 1, atmospheric vapor is adhered onto the surface of the resist film 102 owing to the function of the hygroscopic compound, and the vapor adhered onto the surface of the resist film 102 is incorporated into and integrated with the water 103 filled between the projection lens 106 and the resist film 102 due to the surface tension of the water and the hydrophobic property of the surface of the resist film. Accordingly, even when the water 103 filled between the projection lens 106 and the resist film 102 is evaporated and reduced in the quantity, the reduced quantity can be covered by the vapor incorporated from the air. Therefore, no space is formed in an upper portion of the region between the projection lens 106 and the resist film 102, resulting in forming the resist pattern 105 in a good shape.

Embodiment 2

A pattern formation method according to Embodiment 2 of the invention will now be described with reference to FIGS. 2A through 2D.

Figure 2A:
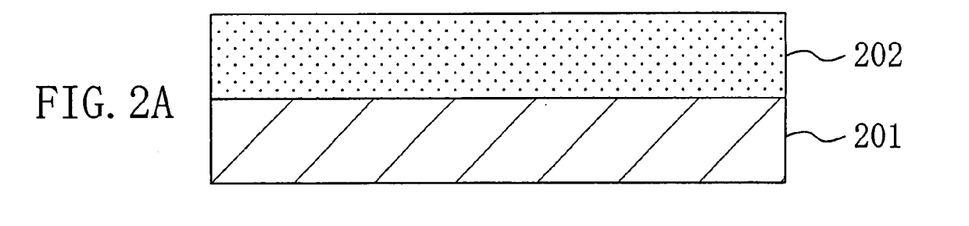
FIGS. 2A, 2B, 2C and 2D are cross-sectional views for showing procedures in a pattern formation method according to Embodiment 2 of the invention.

First, a negative chemically amplified resist material having the following composition is prepared:

Base polymer: poly((norbornene-5-methylenecarboxylic acid)–(maleic anhydride)) (wherein norbornene-5-methylenecarboxylic acid:maleic anhydride=50 mol %:50 mol %) . . . 2 g Crosslinking agent: 1,3,5-N-(trihydroxymethyl) melamine . . . 0.7 g Acid generator: triphenylsulfonium nonaflate . . . 0.06 g Hygroscopic compound: polyethylene glycol . . . 0.06 g Solvent: propylene glycol monomethyl ether acetate . . . 20 g Next, as shown in FIG. 2A, the aforementioned chemically amplified resist material is applied on a substrate 201 so as to form a resist film 202 with a thickness of 0.35 μm.

Figure 2B:
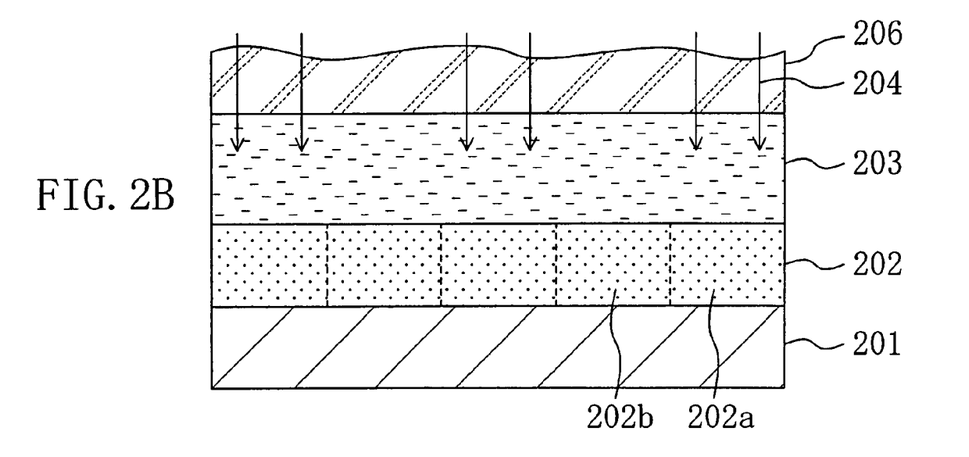

Then, as shown in FIG. 2B, with a region between the resist film 202 and a projection lens 206 filled with water 203, pattern exposure is carried out by irradiating the resist film 202 with exposing light 204 of ArF excimer laser with NA of 0.65 through a mask not shown. Thus, an exposed portion 202a of the resist film 202 becomes insoluble in an alkaline developer due to the function of the crosslinking agent because an acid is generated from the acid generator therein while an unexposed portion 202b of the resist film 202 remains soluble in an alkaline developer because no acid is generated from the acid generator therein.

Figure 2C:
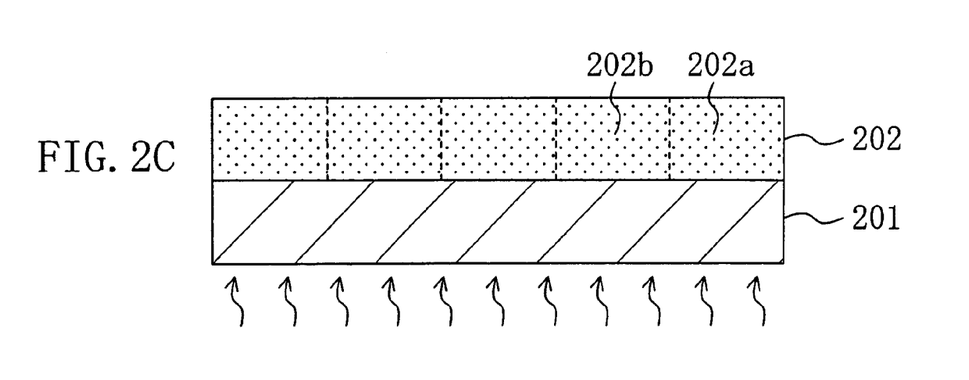
Figure 2D:
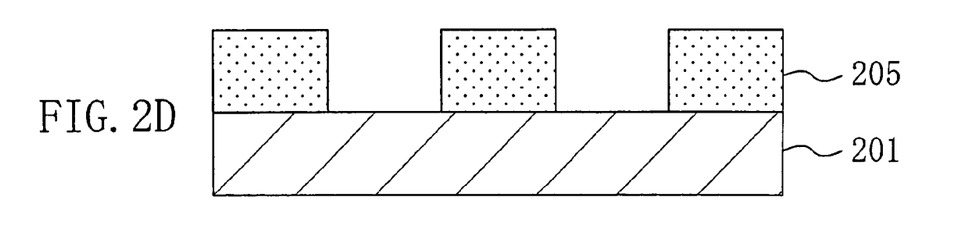

After the pattern exposure, as shown in FIG. 2C, the resist film 202 is baked with a hot plate at a temperature of 120° C. for 60 seconds, and the resultant resist film is developed with a 2.38 wt % tetramethylammonium hydroxide developer (alkaline developer). In this manner, a resist pattern 205 made of the exposed portion 202a of the resist film 202 and having a line width of 0.09 μm can be formed in a good rectangular shape as shown in FIG. 2D.

In Embodiment 2, atmospheric vapor is adhered onto the surface of the resist film 202 owing to the function of the hygroscopic compound, and the vapor adhered onto the surface of the resist film 202 is incorporated into and integrated with the water 203 filled between the projection lens 206 and the resist film 202 due to the surface tension of the water and the hydrophobic property of the surface of the resist film. Accordingly, even when the water 203 filled between the projection lens 206 and the resist film 202 is evaporated and reduced in the quantity, the reduced quantity can be covered by the vapor incorporated from the air, resulting in forming the resist pattern 205 in a good shape.

Embodiment 3

A pattern formation method according to Embodiment 3 of the invention will now be described with reference to FIGS. 3A through 3D.

Figure 3A:
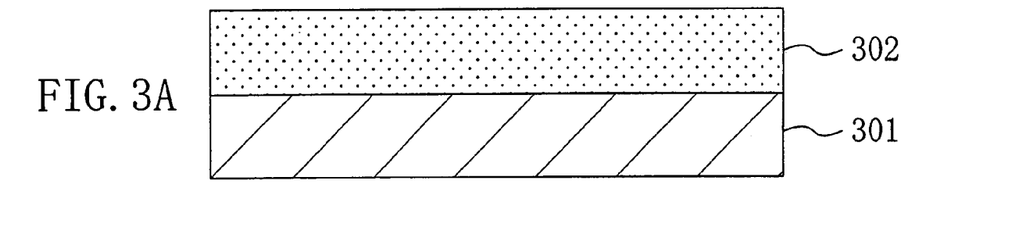
FIGS. 3A, 3B, 3C and 3D are cross-sectional views for showing procedures in a pattern formation method according to Embodiment 3 of the invention.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Solvent: propylene glycol monomethyl ether acetate . . . 20 g Next, as shown in FIG. 3A, the aforementioned chemically amplified resist material is applied on a substrate 301 so as to form a resist film 302 with a thickness of 0.35 μm.

Figure 3B:
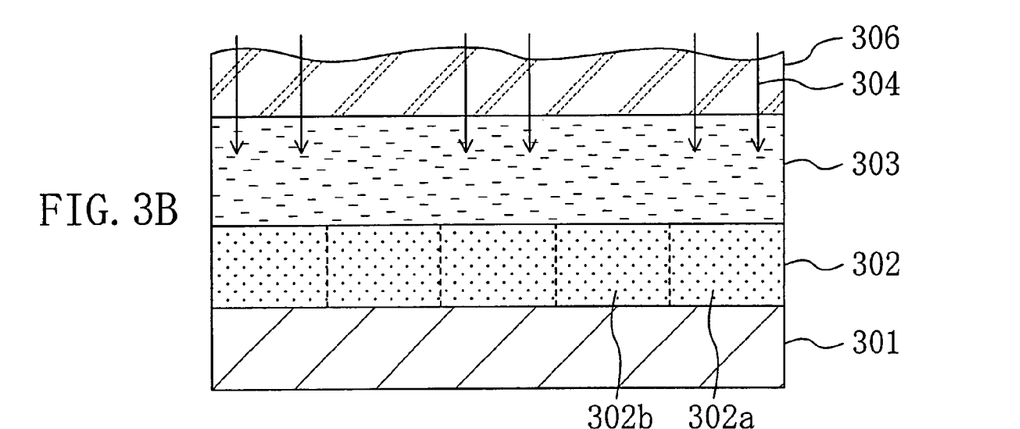

Then, as shown in FIG. 3B, with a region between the resist film 302 and a projection lens 306 filled with water 303 including 5 wt % of glycerin (a hygroscopic compound), pattern exposure is carried out by irradiating the resist film 302 with exposing light 304 of ArF excimer laser with NA of 0.65 through a mask not shown. Thus, an exposed portion 302a of the resist film 302 becomes soluble in an alkaline developer because an acid is generated from the acid generator therein while an unexposed portion 302b of the resist film 302 remains insoluble in an alkaline developer because no acid is generated from the acid generator therein.

Figure 3C:
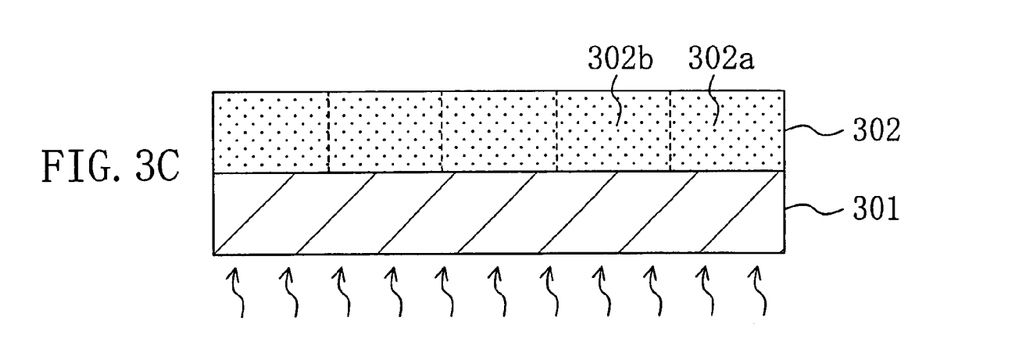
Figure 3D:
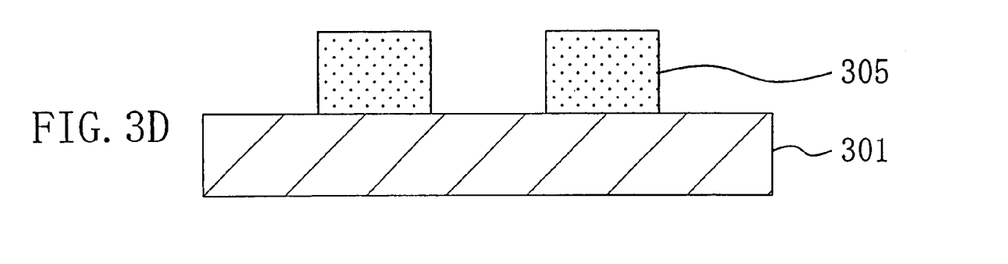

After the pattern exposure, as shown in FIG. 3C, the resist film 302 is baked with a hot plate at a temperature of 110° C. for 60 seconds, and the resultant resist film is developed with a 2.38 wt % tetramethylammonium hydroxide developer (alkaline developer). In this manner, a resist pattern 305 made of the unexposed portion 302b of the resist film 302 and having a line width of 0.09 μm can be formed in a good rectangular shape as shown in FIG. 3D.

In Embodiment 3, atmospheric vapor is adhered onto the surface of the resist film 302 owing to the function of the hygroscopic compound, and the vapor adhered onto the surface of the resist film 302 is incorporated into and integrated with the water 303 filled between the projection lens 306 and the resist film 302 due to the surface tension of the water and the hydrophobic property of the surface of the resist film. Accordingly, even when the water 303 filled between the projection lens 306 and the resist film 302 is evaporated and reduced in the quantity, the reduced quantity can be covered by the vapor incorporated from the air, resulting in forming the resist pattern 305 in a good shape.

In each of Embodiments 1 through 3, ethylene glycol, polyethylene glycol, glycerin, N-methyl-2-pyrrolidone or the like can be appropriately used as the hygroscopic compound.

Also, the amount of the hygroscopic compound to be included in the resist film or the water can be approximately several wt %, or may be larger or smaller than this.

Embodiment 4

A pattern formation method according to Embodiment 4 of the invention will now be described with reference to FIGS. 4A through 4D.

Figure 4A:
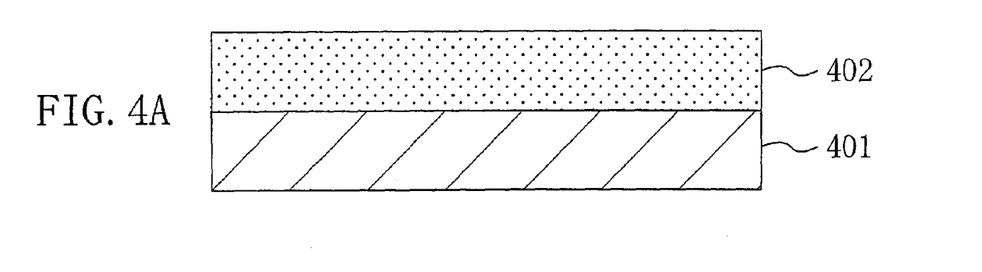
FIGS. 4A, 4B, 4C and 4D are cross-sectional views for showing procedures in a pattern formation method according to Embodiment 4 of the invention.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Rare earth compound: yttrium oxide . . . 0.07 g Solvent: propylene glycol monomethyl ether acetate . . . 20 g Next, as shown in FIG. 4A, the aforementioned chemically amplified resist material is applied on a substrate 401 so as to form a resist film 402 with a thickness of 0.35 μm.

Figure 4B:
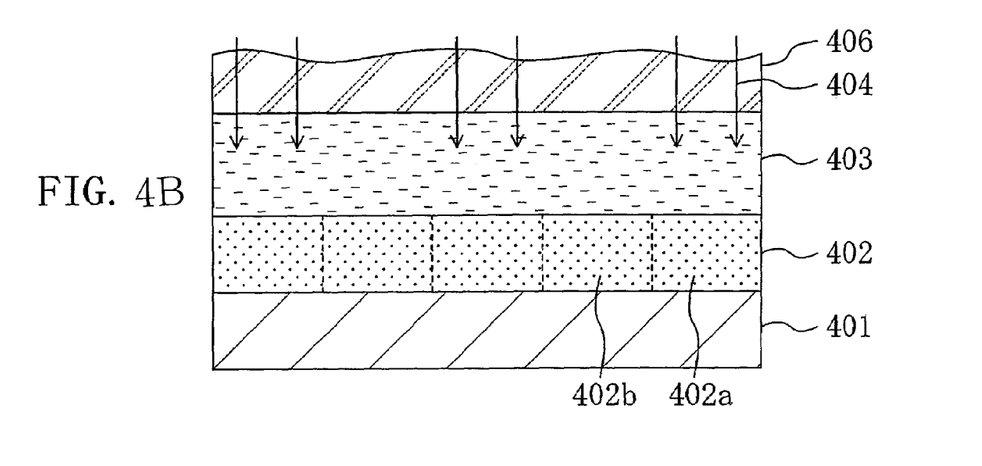

Then, as shown in FIG. 4B, with a region between the resist film 402 and a projection lens 406 filled with water 403, pattern exposure is carried out by irradiating the resist film 402 with exposing light 404 of ArF excimer laser with NA of 0.65 through a mask not shown. Thus, an exposed portion 402a of the resist film 402 becomes soluble in an alkaline developer because an acid is generated from the acid generator therein while an unexposed portion 402b of the resist film 402 remains insoluble in an alkaline developer because no acid is generated from the acid generator therein.

Figure 4C:
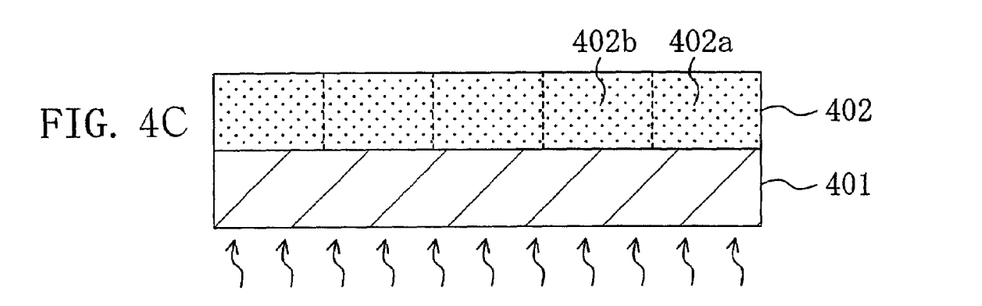
Figure 4D:
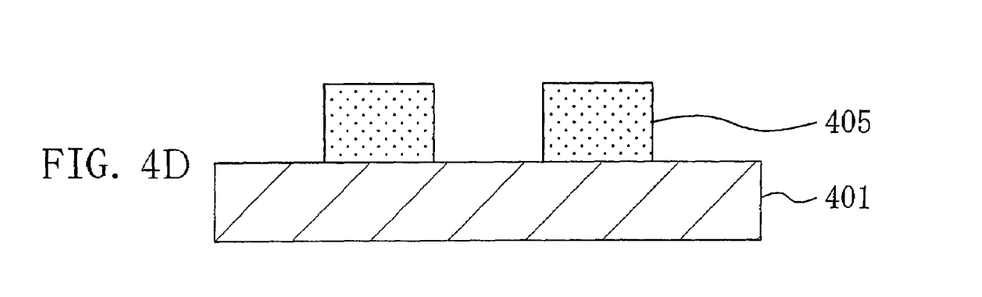

After the pattern exposure, as shown in FIG. 4C, the resist film 402 is baked with a hot plate at a temperature of 110° C. for 60 seconds, and the resultant resist film is developed with a 2.38 wt % tetramethylammonium hydroxide developer (alkaline developer). In this manner, a resist pattern 405 made of the unexposed portion 402b of the resist film 402 and having a line width of 0.09 μm can be formed in a good rectangular shape as shown in FIG. 4D.

In Embodiment 4, atmospheric vapor is adhered onto the surface of the resist film 402 owing to the function of the rare earth compound, and the vapor adhered onto the surface of the resist film 402 is incorporated into and integrated with the water 403 filled between the projection lens 406 and the resist film 402 due to the surface tension of the water and the hydrophobic property of the surface of the resist film. Accordingly, even when the water 403 filled between the projection lens 406 and the resist film 402 is evaporated and reduced in the quantity, the reduced quantity can be covered by the vapor incorporated from the air, resulting in forming the resist pattern 405 in a good shape.

Embodiment 5

A pattern formation method according to Embodiment 5 of the invention will now be described with reference to FIGS. 5A through 5D.

Figure 5A:
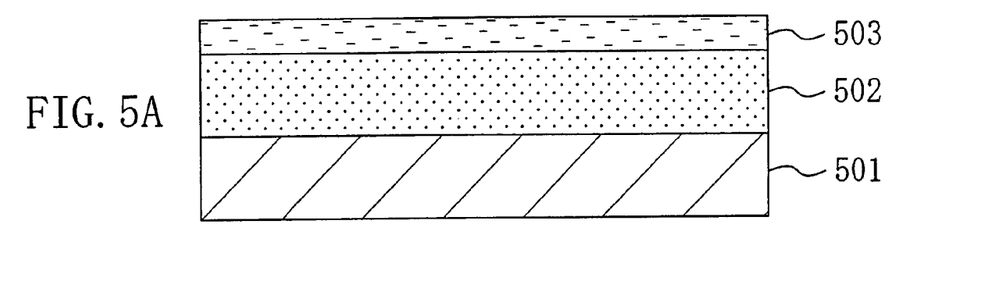
FIGS. 5A, 5B, 5C and 5D are cross-sectional views for showing procedures in a pattern formation method according to Embodiment 5 of the invention.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Solvent: propylene glycol monomethyl ether acetate . . . 20 g Next, as shown in FIG. 5A, the aforementioned chemically amplified resist material is applied on a substrate 501 so as to form a resist film 502 with a thickness of 0.35 μm. Subsequently, a solution 503 including ammonium ceric sulfate (a rare earth compound) is supplied onto the resist film 502 for, for example, 30 seconds by a dip method or the like, and thereafter, the solution 503 is removed. Thus, the rare earth compound remains on the resist film 502.

Figure 5B:
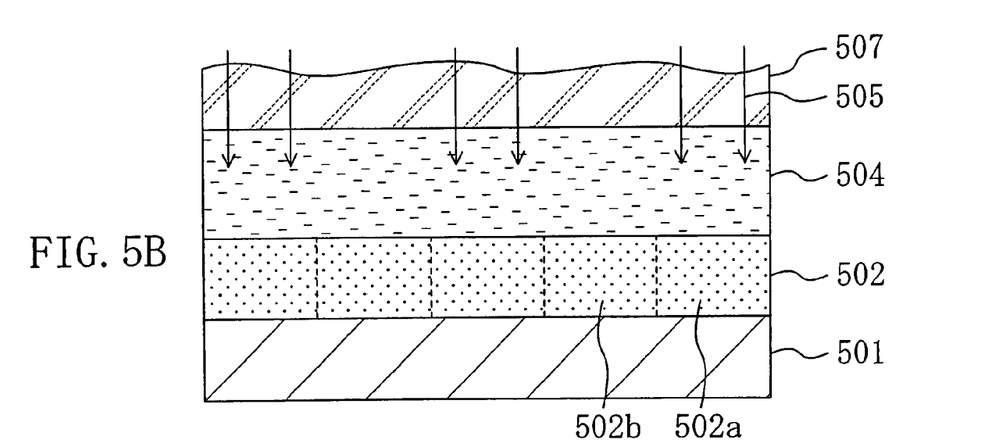

Then, as shown in FIG. 5B, with a region between the resist film 502 and a projection lens 507 filled with water 504, pattern exposure is carried out by irradiating the resist film 502 with exposing light 504 of ArF excimer laser with NA of 0.65 through a mask not shown. Thus, an exposed portion 502a of the resist film 502 becomes soluble in an alkaline developer because an acid is generated from the acid generator therein while an unexposed portion 502b of the resist film 502 remains insoluble in an alkaline developer because no acid is generated from the acid generator therein.

Figure 5C:
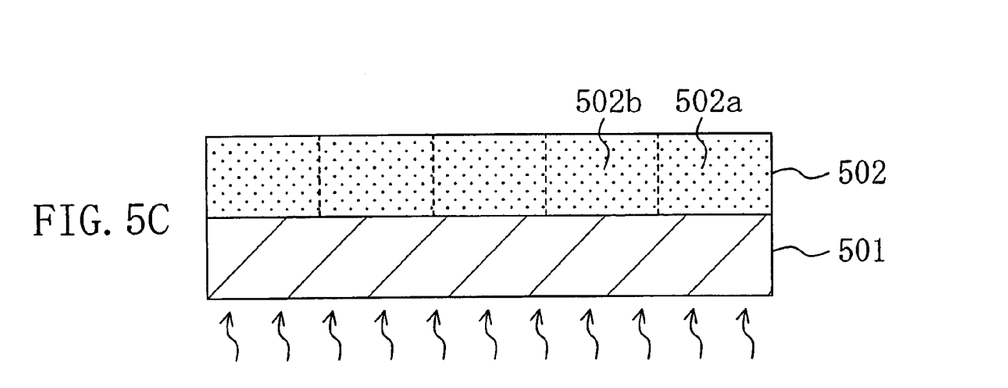
Figure 5D:
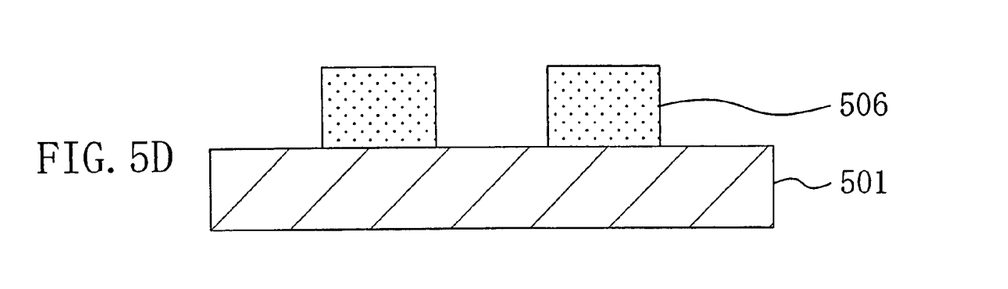

After the pattern exposure, as shown in FIG. 5C, the resist film 502 is baked with a hot plate at a temperature of 110° C. for 60 seconds, and the resultant resist film is developed with a 2.38 wt % tetramethylammonium hydroxide developer (alkaline developer). In this manner, a resist pattern 506 made of the unexposed portion 502b of the resist film 502 and having a line width of 0.09 μm can be formed in a good rectangular shape as shown in FIG. 5D.

In Embodiment 5, atmospheric vapor is adhered onto the surface of the resist film 502 owing to the function of the rare earth compound, and the vapor adhered onto the surface of the resist film 502 is incorporated into and integrated with the water 504 filled between the projection lens 507 and the resist film 502 due to the surface tension of the water and the hydrophobic property of the surface of the resist film. Accordingly, even when the water 504 filled between the projection lens 507 and the resist film 502 is evaporated and reduced in the quantity, the reduced quantity can be covered by the vapor incorporated from the air, resulting in forming the resist pattern 506 in a good shape.

In order to supply the solution 503 including the rare earth compound onto the resist film 502, the solution 503 may be dropped on the resist film 502 (a paddle method), the substrate having the resist film 502 thereon may be dipped in the solution 503 (the dip method), or the solution 503 may be sprayed on the resist film 502 (a spray method). The rare earth compound included in the solution 503 can be definitely supplied onto the surface of the resist film 502 by any of these methods.

Embodiment 6

A pattern formation method according to Embodiment 6 of the invention will now be described with reference to FIGS. 6A through 6D.

Figure 6A:
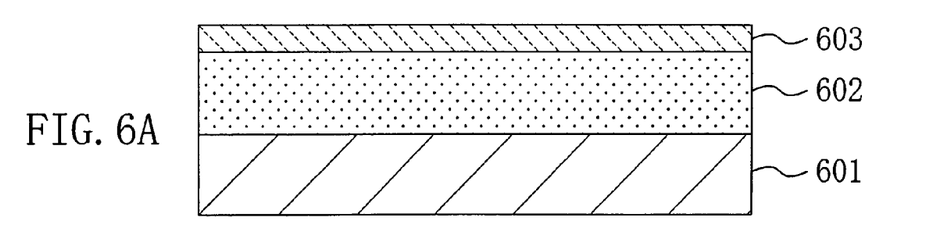
FIGS. 6A, 6B, 6C and 6D are cross-sectional views for showing procedures in a pattern formation method according to Embodiment 6 of the invention.

First, a positive chemically amplified resist material having the following composition is prepared:

Base polymer: poly((norbornene-5-methylene-t-butylcarboxylate)–(maleic anhydride)) (wherein norbornene-5-methylene-t-butylcarboxylate:maleic anhydride=50 mol %:50 mol %) . . . 2 g Acid generator: triphenylsulfonium nonaflate . . . 0.06 g Solvent: propylene glycol monomethyl ether acetate . . . 20 g Next, as shown in FIG. 6A, the aforementioned chemically amplified resist material is applied on a substrate 601 so as to form a resist film 602 with a thickness of 0.35 µm. Subsequently, a nonaqueous film 603 (with a thickness of 0.07 µm) made of a polymethyl methacrylate film including 7 wt % of neodymium oxide (a rare earth compound) is formed on the resist film 602.

Figure 6B:
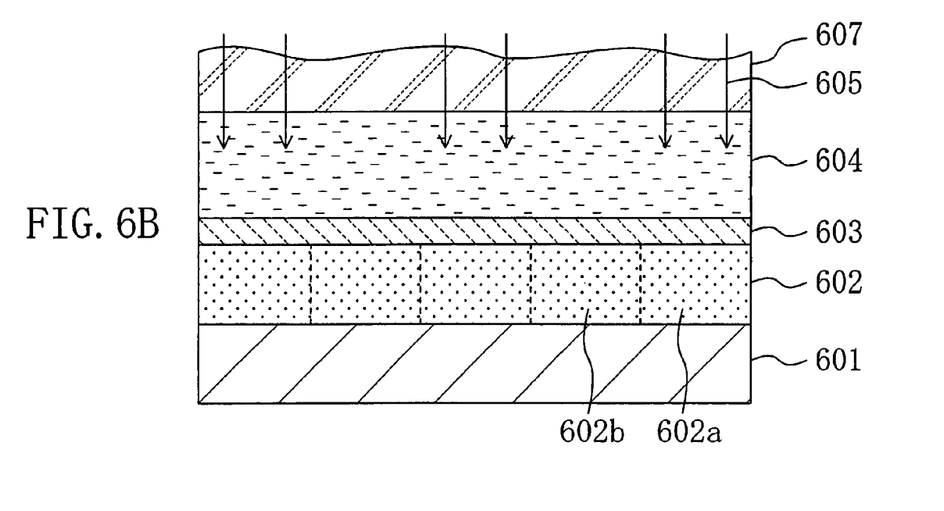

Then, as shown in FIG. 6B, with a region between the nonaqueous film 603 and a projection lens 607 filled with water 604, pattern exposure is carried out by irradiating the nonaqueous film 603 and the resist film 602 with exposing light 605 of ArF excimer laser with NA of 0.65 through a mask not shown. Thus, an exposed portion 602a of the resist film 602 becomes soluble in an alkaline developer because an acid is generated from the acid generator therein while an unexposed portion 602b of the resist film 602 remains insoluble in an alkaline developer because no acid is generated from the acid generator therein.

Figure 6C:
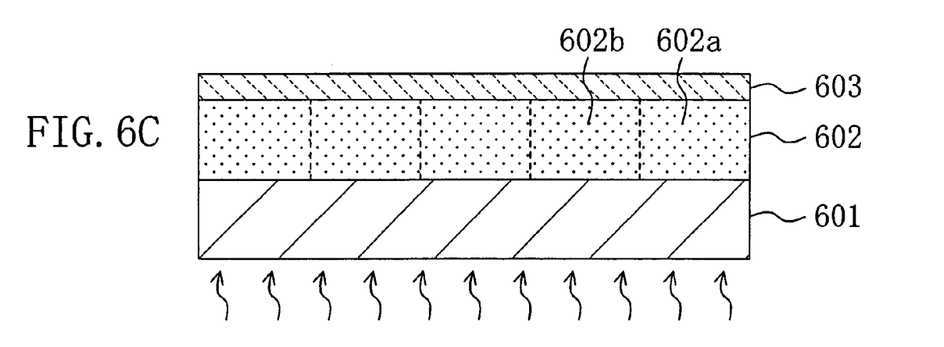
Figure 6D:
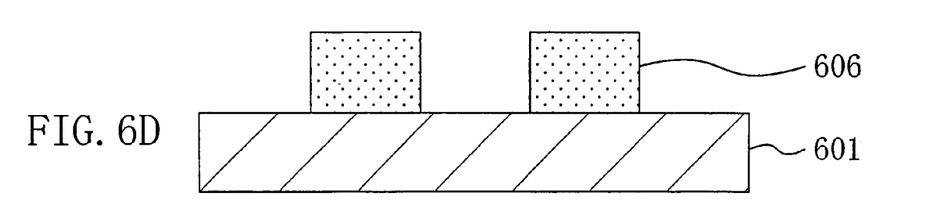

After the pattern exposure, as shown in FIG. 6C, the resist film 602 is baked with a hot plate at a temperature of 110° C. for 60 seconds, and the resultant resist film is developed with a 2.38 wt % tetramethylammonium hydroxide developer (alkaline developer). In this manner, a resist pattern 606 made of the unexposed portion 602b of the resist film 602 and having a line width of 0.09 µm can be formed in a good rectangular shape as shown in FIG. 6D.

In Embodiment 6, atmospheric vapor is adhered onto the surface of the nonaqueous film 603 owing to the function of the rare earth compound, and the vapor adhered onto the surface of the nonaqueous film 603 is incorporated into and integrated with the water 604 filled between the projection lens 607 and the nonaqueous film 603 due to the surface tension of the water and the hydrophobic property of the surface of the nonaqueous film. Accordingly, even when the water 604 filled between the projection lens 607 and the nonaqueous film 603 is evaporated and reduced in the quantity, the reduced quantity can be covered by the vapor incorporated from the air, resulting in forming the resist pattern 606 in a good shape.

Although the polymethyl methacrylate film is used as the nonaqueous film 603 in Embodiment 6, the nonaqueous film 603 may be an olefin film such as a polyethylene film, a polypropylene film or a film of a copolymer of ethylene and propylene instead.

The rare earth compound used in each of Embodiments 4 through 6 may be appropriately selected from an oxide, a chloride, a sulfate, a nitrate, a hydroxide, an acetate and an octylate. The amount of the rare earth compound to be included in the resist film, the water or the nonaqueous film can be approximately several wt %, or may be larger or smaller than this.

Examples of the oxide of the rare earth compound are yttrium oxide, neodymium oxide, cerium oxide, lanthanum oxide and scandium oxide.

An example of the chloride of the rare earth compound is cerium chloride.

Examples of the sulfate of the rare earth compound are ceric sulfate and ammonium ceric sulfate.

Examples of the nitrate of the rare earth compound are cerium nitrate, ammonium cerium nitrate and lanthanum nitrate.

An example of the hydroxide of the rare earth compound is cerium hydroxide.

An example of the acetate of the rare earth compound is cerium acetate.

An example of the octylate of the rare earth compound is cerium octylate.

Furthermore, in each of Embodiments 1 through 6, the exposing light can be KrF excimer laser, $F_2$ laser, KrAr laser, $Ar_2$ laser or the like instead of the ArF excimer laser.

Moreover, in each of Embodiments 1 through 6, the water supplied onto the resist film may include an additive such as a surfactant if necessary.

What is claimed is:

1. A pattern formation method comprising the steps of:
  forming a film including a material of absorbing moisture on a resist film;
  performing pattern exposure by selectively irradiating said resist film with exposing light while supplying immersion solution onto said film; and
  forming a resist pattern by developing said resist film after the pattern exposure.

2. The pattern formation method of claim 1,
  wherein said material of absorbing moisture is hygroscopic compound or a rare earth compound.

3. The pattern formation method of claim 2,
  wherein said rare earth compound is an oxide, a chloride, a sulfate, a nitrate, a hydroxide, an acetate, an octylate, yttrium oxide, neodymium oxide, cerium oxide, lanthanum oxide, scandium oxide, cerium chloride, ceric sulfate, ammonium ceric sulfate, cerium nitrate, ammonium cerium nitrate, lanthanum nitrate, cerium hydroxide, cerium acetate or cerium octylate.

4. The pattern formation method of claim 2,
  wherein said film including a rare earth compound is a nonaqueous film.

5. The pattern formation method of claim 4,
  wherein said nonaqueous film is an olefin film.

6. The pattern formation method of claim 5,
  wherein said olefin film is a polyethylene film, a polypropylene film or a film of a copolymer of ethylene and propylene.

7. The pattern formation method of claim 1,
  wherein said exposing light is KrF excimer laser, ArF excimer laser, $F_2$ laser, KrAr laser or $Ar_2$ laser.

* * * * *